(12) United States Patent
Yan et al.

(10) Patent No.: US 7,976,899 B2
(45) Date of Patent: Jul. 12, 2011

(54) METHODS FOR SELECTIVE DEPOSITION OF GRADED MATERIALS ON CONTINUOUSLY FED OBJECTS

(75) Inventors: Min Yan, Ballston Lake, NY (US); Ahmet Gun Erlat, Clifton Park, NY (US); Paul Alan McConnelee, Schenectady, NY (US); Anil Raj Duggal, Niskayuna, NY (US); Svetlana Rogojevic, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 1061 days.

(21) Appl. No.: 11/585,295

(22) Filed: Oct. 23, 2006

(65) Prior Publication Data

US 2008/0092814 A1    Apr. 24, 2008

(51) Int. Cl.
*B05D 1/32* (2006.01)
(52) U.S. Cl. ...... 427/282; 427/569; 427/571; 204/192.1; 204/192.12; 117/95; 117/103; 117/104; 117/108; 118/720; 118/721
(58) Field of Classification Search ............... 427/569, 427/571, 575, 282; 204/192.1, 192.12; 117/103, 117/104, 108, 95; 118/720, 721
See application file for complete search history.

(56) References Cited

U.S. PATENT DOCUMENTS

| | | | |
|---|---|---|---|
| 4,416,217 A | 11/1983 | Nakamura et al. | |
| 6,821,348 B2 * | 11/2004 | Baude et al. | 118/720 |
| 6,873,452 B2 | 3/2005 | Tseng et al. | |
| 7,297,361 B2 * | 11/2007 | Baude et al. | 427/98.4 |
| 2003/0059526 A1 | 3/2003 | Benson et al. | |
| 2003/0152691 A1 * | 8/2003 | Baude et al. | 427/96 |
| 2003/0192584 A1 | 10/2003 | Beckenbaugh et al. | |
| 2006/0024442 A1 | 2/2006 | Ovshinsky | |
| 2006/0115588 A1 * | 6/2006 | Takeuchi et al. | 427/248.1 |
| 2007/0148346 A1 * | 6/2007 | Kim et al. | 427/248.1 |

FOREIGN PATENT DOCUMENTS

| | | | |
|---|---|---|---|
| EP | 0157573 | * | 3/1985 |
| JP | 05078818 A | | 3/1993 |

OTHER PUBLICATIONS

Bower, C.L., et al., "Continuous Coating of Discrete Areas of a Flexible Web". Fluid Mechanics and Transport Phenomena, AIChE Journal, vol. 53, No. 7, Jul. 2007, pp. 1644-1657.*
Blake, T.D., et al., "Continuous Coating of a Discrete Areas of a Flexbile Web by a Roll-to-Roll Process." Presented at the 14st International Coating Science and Technology Symposium, Sep. 2008, pp. 1-4.*
European Search Report dated Feb. 22, 2008.

* cited by examiner

*Primary Examiner* — Bret Chen
(74) *Attorney, Agent, or Firm* — Mary Louise Gioeni

(57) ABSTRACT

Embodiments of the invention include a selective deposition method that allows for coating of selective portions of an object, such as an electronic device, and inhibits coating of other selective portions of the object, such as the electric contacts. The selective deposition method includes providing a web to transport the object through a deposition chamber. The web may include and reference mechanisms to register the object relative to the web. The method further includes providing deposition material and a shadow mask that has open spaces in it to inhibit coating selective portions of the object. The deposition material serves as the coating material.

8 Claims, 6 Drawing Sheets

METHODS FOR SELECTIVE DEPOSITION OF GRADED MATERIALS ON CONTINUOUSLY FED OBJECTS

BACKGROUND

The invention generally relates to the selective deposition of graded materials, and more particularly, to the selective deposition of materials in such a way as to provide barrier coatings on certain portions of objects transported through a deposition chamber while leaving certain other portions of the objects uncoated.

Electroluminescent ("EL") devices, which may be classified as either organic or inorganic, are well known in the graphic display and imaging arts. EL devices have been produced in different shapes for many applications. Inorganic EL devices, however, typically suffer from a required high activation voltage and low brightness. On the other hand, organic EL devices ("OELDs"), which have been developed more recently, offer the benefits of lower activation voltage and higher brightness in addition to simple manufacture, and, thus, the promise of more widespread applications.

An OELD is typically a thin film structure formed on a substrate such as glass, metal or plastic. A light-emitting layer of an organic EL material and optional adjacent semiconductor layers are sandwiched between a cathode and an anode. The semiconductor layers may be either hole (positive charge)-injecting or electron (negative charge)-injecting layers and also may comprise organic materials. The material for the light-emitting layer may be selected from many organic EL materials. The light emitting organic layer may itself consist of multiple sublayers, each comprising a different organic EL material. State-of-the-art organic EL materials can emit electromagnetic ("EM") radiation having narrow ranges of wavelengths in the visible spectrum. Unless specifically stated, the terms "EM radiation" and "light" are used interchangeably in this disclosure to mean generally radiation having wavelengths in the range from ultraviolet ("UV") to mid-infrared ("mid-IR") or, in other words, wavelengths in the range from about 300 nm to about 10 micrometer. To achieve white light, prior-art devices incorporate closely arranged OELDs emitting blue, green, and red light. These colors are mixed to produce white light.

Conventional OELDs are built on glass substrates because of a combination of transparency and low permeability of glass to oxygen and water vapor. A high permeability of these and other reactive species can lead to corrosion or other degradation of the devices. However, glass substrates are not suitable for certain applications in which flexibility is desired. In addition, manufacturing processes involving large glass substrates are inherently slow and, therefore, result in high manufacturing cost. Flexible plastic substrates have been used to build OELDs. However, these substrates are not impervious to oxygen and water vapor, and, thus, are not suitable per se for the manufacture of long-lasting OELDs. In order to improve the resistance of these substrates to oxygen and water vapor, alternating layers of polymeric and ceramic materials have been applied to a surface of a substrate. It has been suggested that in such multilayer barriers, a polymeric layer acts to mask defects in an adjacent ceramic layer, and therefore provides a tortuous pathway to reduce the diffusion rates of oxygen and/or water vapor through the channels made possible by the defects in the ceramic layer. However, an interface between a polymeric layer and a ceramic layer is generally weak due to the incompatibility of the adjacent materials, and the layers, thus, are prone to be delaminated.

Organic electronics may supplant conventional silicon-based technology if they can be manufactured for large area electronic devices at a much lower cost. Examples of low-cost electronic technologies include organic light-emitting devices (OLEDs), organic photovoltaic devices, thin-film transistors (TFTs) and TFT arrays using organic and solution-processible inorganic materials, and other more complicated circuits. Other electronic technologies include liquid crystal devices (LCDs), photovoltaic cells, electrochromic devices, and electrophoretic devices. Such electronic technologies are conventionally manufactured using predominantly batch-mode semiconductor fabrication processes. Such processes do not, however, fulfill the promise of low cost and large area potential. Thus, considerable research effort is being directed to fabricating organic electronic devices using printing processes on roll-to-roll compatible, mechanically flexible substrates. For example, Konarka Technologies Inc. has developed a photovoltaic cell manufacturing process that allows printing photo-reactive materials onto flexible plastic substrate in continuous roll-to-roll (R2R) fashion, similar to how newspaper is printed on large rolls of paper. Konarka's R2R manufacturing process enables production to scale easily and results in significantly reduced costs over previous generations of solar cells. See, for example, U.S. patent application publication 2003/0192584. SiPix Imaging Inc. has developed a R2R manufacturing process that produces large arrays of microscale containers on a flexible plastic substrate that may be used to fabricate ultra-low power, high contrast electrophoretic display devices (electronic paper). See, for example, U.S. Pat. No. 6,873,452.

OLEDs represent the most advanced of current organic electronic technologies as evidenced by the fact that OLED display products are now commercially available. However, these products are still manufactured using predominantly batch-mode conventional semiconductor fabrication processes and so have still not demonstrated the low cost and large area potential of organic electronics. A key impediment for this effort is the lack of availability of a mechanically flexible substrate that fulfills all the requirements for a functional OLED device. Further, commercial OLED devices use glass substrates and glass or metal encapsulation with epoxy seals and desiccants. These processes provide both low throughput and high cost.

To meet the stringent requirements put forth for the design of OLEDs and other organic electronic devices on flexible or inflexible substrates, a robust coating design should be realized which avoids easy defect pathways for permeation. Multilayer barrier structures including multiple sputter-deposited aluminum oxide inorganic layers separated by polymer multilayer (PML) processed organic layers have demonstrated promising moisture permeation rates in the range of $10^{-6}$-$10^{-5}$ g/m$^2$/day. It is commonly understood that organic layers may decouple defects in the inorganic layers and prevent the propagation of the defects from one inorganic layer to the other inorganic layers. In other words, the multilayer stack stops defects from propagating in the vertical direction through the coating thickness. A modeling study suggests that this defect decoupling forces a tortuous path for moisture and oxygen diffusion, and thus reduces the permeation rate by several orders of magnitude. Another study suggests that the inorganic-organic multilayer stack leads to higher performance through a transient rather than steady-state phenomenon. Regardless of mechanism, the multilayer barrier stack approach appears to be capable of yielding the required level of performance for OLED applications.

One potential limitation of the multilayer stack approach is that this type of structure tends to suffer from poor adhesion and delamination especially during thermal cycles of the OLED fabrication processes, since the inorganic and organic layers have sharp interfaces with weak bonding structure due to the nature of the sputter deposition and PML processes.

Therefore, there is a continued need to provide, in a continuous process, protective coatings over certain portions of the electronic devices, while leaving other portions of the electronic technology uncoated.

SUMMARY

One embodiment of the invention described herein is directed to a selective deposition assembly that includes a deposition chamber having at least one gas inlet and a web extending through the deposition chamber and positioned between the at least one gas inlet and an object. The web includes openings to enable coating of a deposition material upon selected portions of the object.

Another embodiment of the invention is directed to a system for a fabrication and selective coating system. The system includes a substrate deposition machine to enable coating of a substrate, a fabrication assembly to enable fabrication of an object on the substrate, and a selective coating assembly to enable coating of selective portions of the object.

Another embodiment of the invention is a method for inhibiting coating selective portions of an object. The method includes the steps of transporting the object through a deposition chamber, providing a shadow mask opposite the object for inhibiting coating of selective portions of the object, and providing a deposition material to serve as a coating.

These and other advantages and features will be more readily understood from the following detailed description of preferred embodiments of the invention that is provided in connection with the accompanying drawings.

DETAILED DESCRIPTION OF PREFERRED EMBODIMENTS

Figure 1:
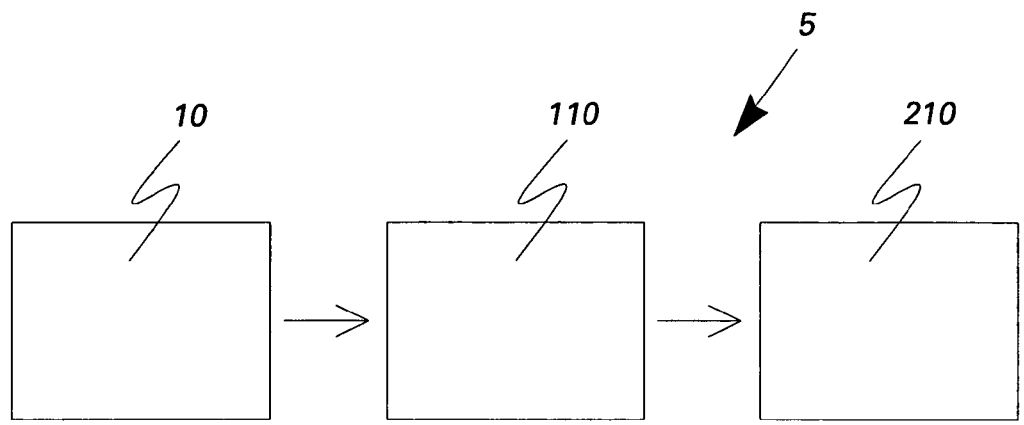
FIG. 1 is a schematic view of a fabrication and selective coating system constructed in accordance with an embodiment of the invention.

Referring to FIG. 1, there is shown a fabrication and selective coating system 5 that includes a substrate deposition machine 10, a fabrication assembly 110, and a selective coating assembly 210. Arrows are provided to indicate the likely pathway for the coating and fabrication of objects, such as, for example, electronic devices. Examples of electronic devices include liquid crystal displays (LCDs); thin-film transistors (TFTs) and TFT arrays using organic, solution-processible inorganic materials; photovoltaic cells; integrated circuits; electrochromic devices; electrophoretic devices; sensors; energy storage devices, including batteries; electric luminescence devices, including OLEDs; components of medical diagnostic systems; and, any opto-electronic devices that need barrier protection. Specifically, a flexible or inflexible substrate is coated in the substrate deposition machine 10. The coated substrate is transferred to the fabrication assembly 110, in which an electronic device is assembled onto the coated substrate. Finally, in the selective coating assembly 210, the electronic device is selectively coated. The substrate deposition machine 10 may utilize a roll-to-roll mechanism or an in-process mechanism to transfer substrates through the machine.

With specific reference to FIGS. 1-4, the deposition machine 10 is illustrated including a first spool chamber 12, a deposition chamber 18, and a second spool chamber 30. The deposition machine 10 may be configured to produce a graded-composition coating, for example a graded-composition diffusion-barrier coating, on a substrate. The first spool chamber 12 includes a first spool 14 about which a web 40 is wound. The web 40 extends through the deposition chamber 18 and into the second spool chamber 30 to a second spool 32. In one exemplary embodiment, the first spool 14 is an unwinding spool and the second spool 32 is a winding spool. The web 40 may serve as a transportation device transporting a substrate through the deposition chamber 18; alternatively, the web 40 may serve as the substrate. Examples of substrates upon which deposition may occur include flexible substrates, such as, for example, films or sheets formed of plastic or metal, and inflexible substrates, such as, for example, blocks or plates formed of glass, metal or plastic.

Substrate materials that may benefit from having a graded-composition diffusion-barrier coating include organic polymeric materials, such as: polyethylene-terephthalate ("PET"); polyacrylates; polycarbonate; silicone; epoxy resins; silicone-functionalized epoxy resins; polyester, such as Mylar® (made by E.I. du Pont de Nemours & Co.); polyimide, such as Kapton® H or Kapton® E (made by du Pont), Apical® AV (made by Kanegafugi Chemical Industry Company), Upilex® (made by UBE Industries, Ltd.); polyethersulfones ("PES," made by Sumitomo); polyetherimide such as Ultem® (made by General Electric Company); and polyethylene naphthalene ("PEN").

Suitable coating compositions for the substrates organic, inorganic, or combinations thereof. These materials are typically reaction or recombination products of reacting plasma species and are deposited onto the substrate surface. Organic coating materials typically comprise carbon, hydrogen, oxygen, and optionally other minor elements, such as sulfur, nitrogen, silicon, etc., depending on the types of reactants. Suitable reactants that result in organic compositions in the coating are straight or branched alkanes, alkenes, alkynes, alcohols, aldehydes, ethers, alkylene oxides, aromatics, etc., having up to 15 carbon atoms. Inorganic and ceramic coating materials typically comprise oxide; nitride; carbide; boride; or combinations thereof of elements of Groups IIA, IIIA, IVA, VA, VIA, VIIA, IB, and IIB; metals of Groups IIIB, IVB, and VB; and rare-earth metals. For example, silicon carbide can be deposited onto a substrate by recombination of plasmas generated from silane ($SiH_4$) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as tetraethoxysilane (TEOS), hexamethyldisiloxane (HMDSO), hexamethyldisilazane (HMDSN), or octamethylcyclotetrasiloxane (D4). Silicon nitride can be deposited from plasmas generated from silane and ammonia. Aluminum oxycarbonitride can be deposited from a plasma generated from a mixture of aluminum tartrate and ammonia. Other combinations of reactants may be chosen to obtain a desired coating composition. The choice of the particular reactants is within the skills of the artisans. A graded composition of the coating is obtained by changing the compositions of the reactants fed into the reactor chamber during the deposition of reaction products to form the coating.

Coating thickness is typically in the range from about 10 nm to about 10000 nm, preferably from about 10 nm to about 1000 nm, and more preferably from about 10 nm to about 200 nm. It may be desired to choose a coating thickness that does not impede the transmission of light through the substrate, such as a reduction in light transmission being less than about 20 percent, preferably less than about 10 percent, and more preferably less than about 5 percent. The coating may be formed by one of many deposition techniques, such as plasma-enhanced chemical-vapor deposition ("PECVD"), radio-frequency plasma-enhanced chemical-vapor deposition ("RFPECVD"), expanding thermal-plasma chemical-vapor deposition ("ETPCVD"), sputtering including reactive sputtering, electron-cyclotron-resonance plasma-enhanced chemical-vapor deposition ("ECRPECVD"), inductively coupled plasma-enhanced chemical-vapor deposition ("ICPECVD"), or combinations thereof. Alternately, the coating may be formed through an evaporative process, a sputtering process, and an atomic layer deposition process.

Further discussion of suitable substrate materials, suitable coating compositions and suitable coating thicknesses is found in co-pending U.S. patent application Ser. No. 10/065,018, filed Sep. 11, 2002 and currently owned by the assignee of the present patent application, the entirety of which is incorporated herein by reference.

Figure 2:
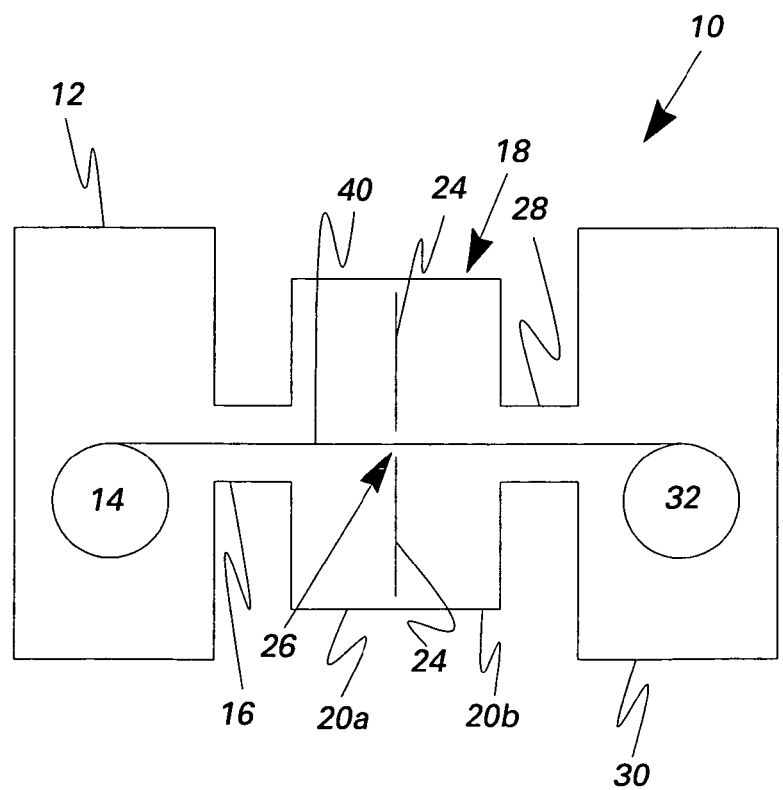
FIG. 2 is a schematic view of a deposition machine for use in the system of FIG. 1.
Figure 3:
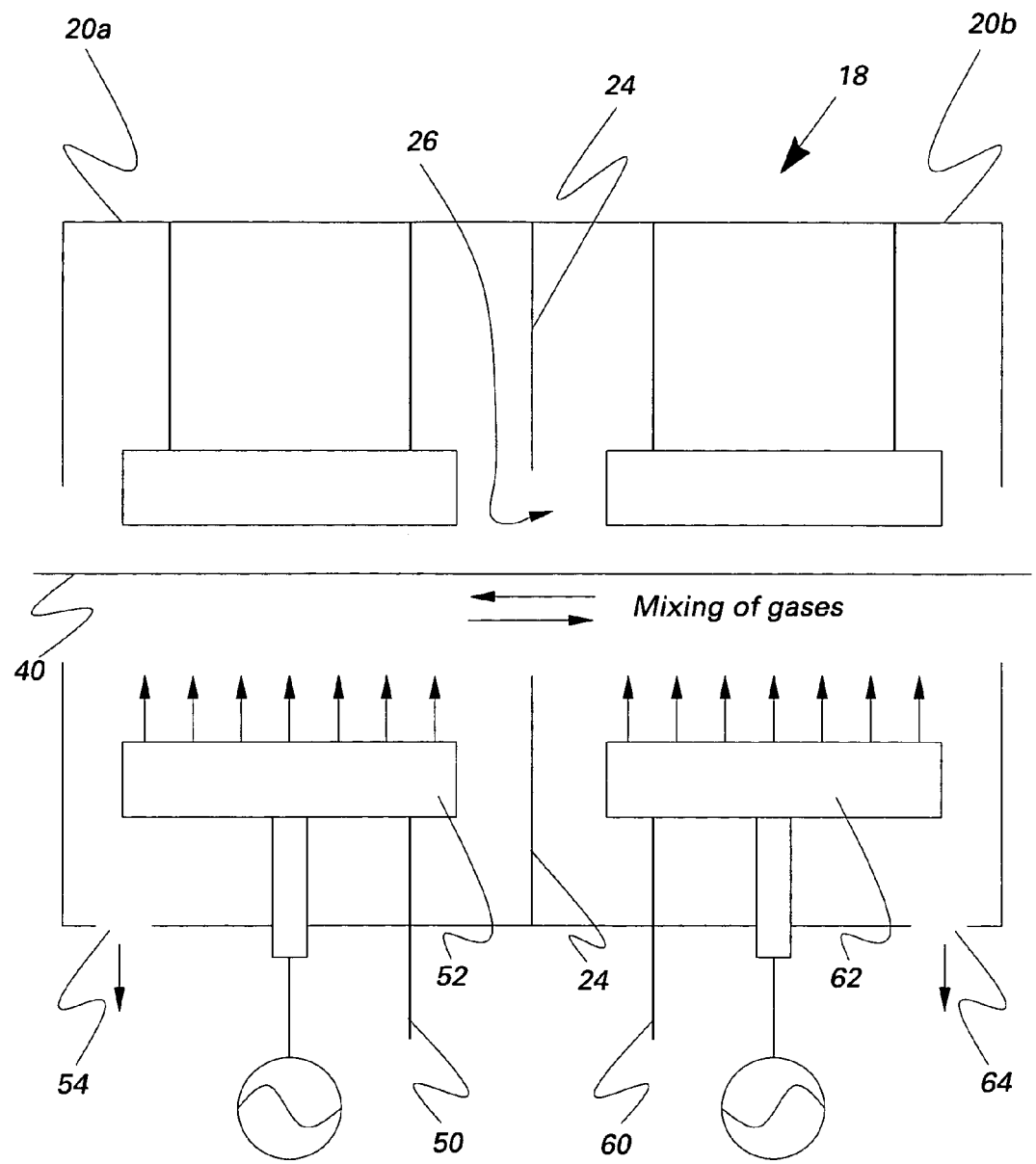
FIG. 3 is a schematic view of the deposition chamber of the deposition machine of FIG. 2.

An outlet 16 extends from the first chamber 12 to the deposition chamber 18 (FIG. 2). An outlet 28 extends from the deposition chamber 18 to the second chamber 32. The deposition chamber 18 includes at least a first chamber area or subchamber 20a and a second chamber area or subchamber 20b. The two chamber areas 20a, 20b are separated by a baffle 24. The baffle 24 has an opening 26. The opening 26 may be adjustable to control the rate of migration of deposition material through the opening 26. The deposition chamber 18 may be under vacuum. Further, for mechanical efficiency, the first and second chambers 12, 30 also may be under vacuum.

Each chamber area includes a deposition assembly, a deposition material outlet and a gas inlet. Specifically, and with reference to FIG. 3, the first chamber area 20a includes a gas inlet 50 extending to a deposition assembly 52. The gas inlet 50 receives a gaseous material which is transported to the deposition assembly 52 to create a deposition mist for the substrate being transported by the web 40. Any excess deposition material may be removed from the first chamber area 20a through the deposition material outlet 54. The second chamber area 20b includes a gas inlet 60 extending to a deposition assembly 62. The gas inlet 60 receives a gaseous material which is transported to the deposition assembly 62 to create a deposition mist for the substrate being transported by the web 40. Any excess deposition material may be removed from the second chamber area 20b through the deposition material outlet 64. The outlets 54, 64 each may be a single port in the respective deposition chamber area 20a, 20b. Alternatively, the outlets 54, 64 each may be multiple ports in the respective deposition chamber areas 20a, 20b. The location of each outlet 54, 64 within the deposition chamber areas 20a, 20b may be engineered to achieve desired gas flow and reactive species distribution.

To form a graded-composition coating on the substrate, it is envisioned that the material received by the first deposition assembly 52 has a different composition than the material received by the second deposition assembly 62. For example, one material may be an organic material, while a second material is an inorganic material or combinations of inorganic and organic.

Figure 4:
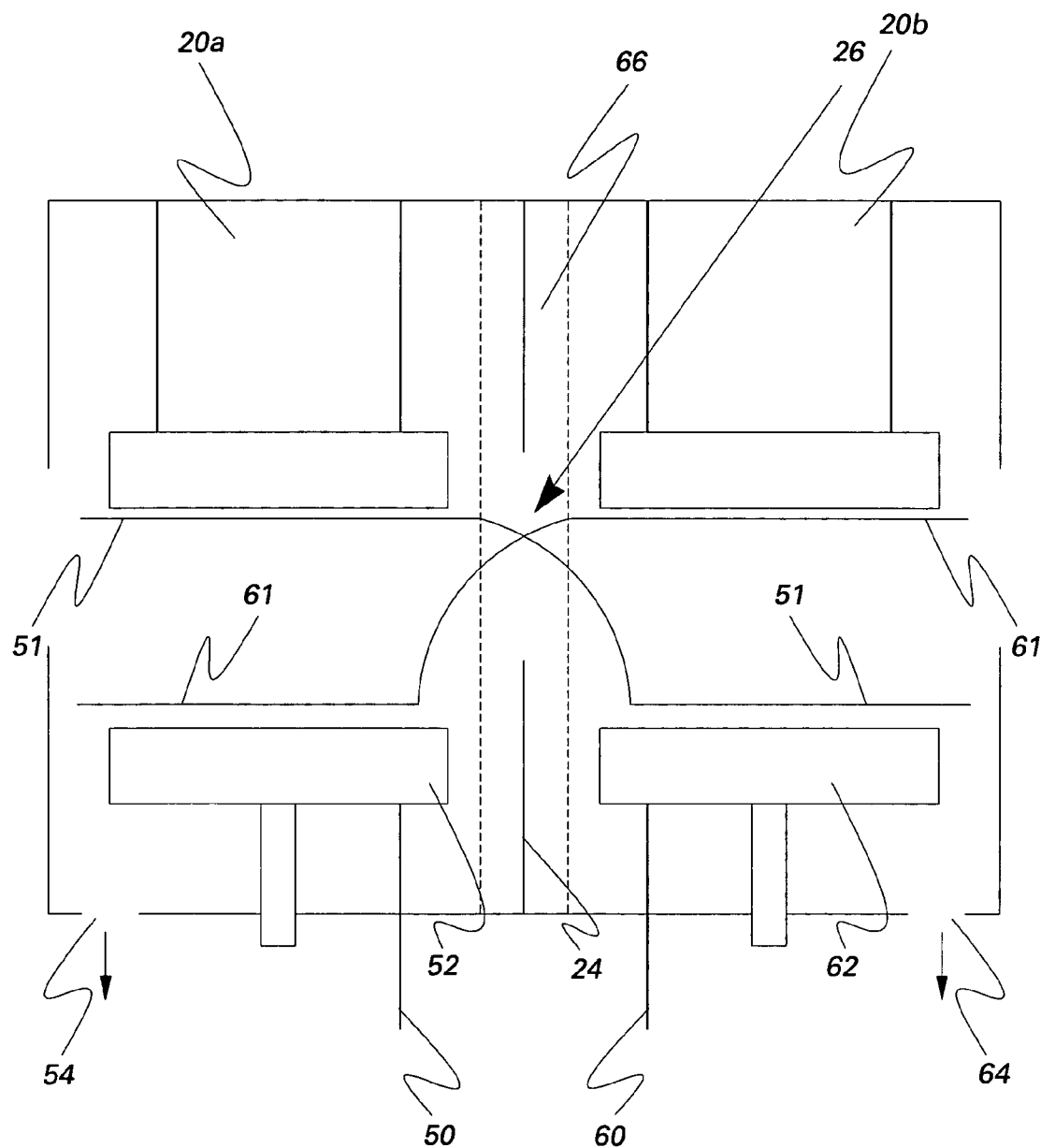
FIG. 4 is a schematic view illustrating a graded deposition process within the deposition chamber of the deposition machine of FIG. 2.

With specific reference to FIG. 4, a function of the baffle 24 and the opening 26 is further described. The baffle 24 is adjusted to create an opening 26 of sufficient size and configuration to allow a certain amount of migration of deposition material to occur from one chamber area to another chamber area. As schematically illustrated in FIG. 4, a gaseous material deposited by the first deposition assembly 52 results in a coating portion 51 having a relatively high composition of the first gaseous material. Also, a gaseous material deposited by the second deposition assembly 62 results in a coating portion 61 having a relatively high composition of the second gaseous material.

Excess deposition material is evacuated from each of the chamber areas 20a, 20b by pumping the material out through the respective outlets 54, 64. The pumping causes a localized pressure differential in each chamber area causing a migration of excess material from most of each the chamber areas 20a, 20b toward the outlets 54, 64. When the pressures in deposition chamber areas 20a and 20b are maintained at the same level, a mix area 66 is formed immediately adjacent to the baffle 24. There is no localized pressure differential in the mix area 66. In this mix area 66, deposition material from the second chamber area 20b is equally likely to migrate into the first chamber area 20a as remain in the second chamber area 20b and deposition material from the first chamber area 20a is equally likely to migrate into the second chamber area 20b as remain in the first chamber area 20a. In this mix area 66, the relative compositions of the deposition materials begin to change. For example, the composition of the coating portion 51 begins to drop in the mix area 66, while the composition of the coating portion 61 begins to increase as an object moves from the first chamber area 20a through the mix area 66 and into the second chamber area 20b. The pressures in deposition chamber areas 20a and 20b also may be deliberately set to different levels to shift the mix area 66 to various locations within the deposition chamber 18. For example, pressure in deposition chamber area 20a may be set lower than that of deposition chamber area 20b. Thus, deposition material from both deposition chamber area 20a and deposition chamber area 20b is more likely to migrate to outlet 54 and therefore mix area 66 will move into deposition chamber 20a. By engineering opening 26, pressures in deposition chamber areas 20a and 20b, gaseous mixture material flows to deposition assemblies 52 and 62, geometry and location of deposition assemblies 52 and 62, geometry and location of outlets 54 and 64, and other process parameters, desired material distribution profiles can be achieved in the deposition chamber areas 20a, 20b.

According to an exemplary embodiment, the substrate to be coated is unwound from the first spool 14. As the web 40 travels through the deposition chamber 18, the first and second deposition assemblies 52, 62 begin depositing, respectively, the first and second materials. Through such a coating process, the substrate is coated by a plurality of materials and in varying compositions along the thickness of the coating.

Further discussion of the coating of substrates is found in co-pending U.S. patent application Ser. No. 11/315,248, filed Dec. 23, 2005 and currently owned by the assignee of the present patent application, the entirety of which is incorporated herein by reference.

It should be appreciated that the web 40 can be wound through the deposition chamber 18 toward the second spool 32 and then wound back through the deposition chamber 18 toward the first spool 14 to obtain a coating having more than three graded zones. Alternatively, and with specific reference to FIG. 4, it should be appreciated that numerous chamber areas or subchambers may be positioned side by side through which the web 40 may be transported. It should be further appreciated that such a substrate deposition machine 10 may be modularly assembled. For example, subchambers may be added to the deposition machine or removed from the deposition machine depending upon the particular application. By being able to add and remove subchambers to the entire substrate coating process, flexibility in applicability for the substrate deposition machine 10 is enhanced. Additionally, it should be appreciated that instead of a roll-to-roll design as illustrated in FIG. 2, the substrate deposition machine 10 may be designed as an "inline" coating machine where the web 40 is not unwound from one spool and wound onto another spool, but instead continually loops between a pair of spools.

After coating, the substrate is then fed into the fabrication assembly 110, where electronic devices are fabricated on the coated substrates. In the fabrication assembly 110, an electronic device 70 (FIG. 5) is fabricated. Some of the fabrication steps may be performed under vacuum or inert atmosphere, while other fabrication steps may be performed under atmospheric conditions. It should be appreciated that certain mechanical and chemical properties are desirable for substrates to be used for mounting electronic devices such as organic light-emitting devices (OLEDs), organic photovoltaic devices, thin-film transistors (TFTs) and TFT arrays using organic and solution-processible inorganic materials, and other more complicated circuits. Mechanical flexibility of the substrate is of importance for roll-to-roll processing, as described herein. Similar flexibility is also required for various end-use applications, such as, for example, "roll-up" displays. For "inline" fabrication, flexibility of the substrate is not as important. Chemical resistance is also important for substrate compatibility with the various solvents and chemicals used in the organic electronic device fabrication steps. Further discussion of important mechanical and chemical properties for suitable substrates is found in M. Yan, et al., "A Transparent, High Barrier, and High Heat Substrate for Organic Electronics," IEEE, V. 93, N. 8, Aug. 2005, p. 1468-1477, the entirety of which is incorporated herein by reference.

The compositionally graded ultra-high barrier (UHB) coating described above can effectively stop defects from propagating through the coating thickness. In such a barrier structure, organic materials effectively decouple defects growing in the thickness direction but, instead of having a sharp interface between inorganic and organic materials, there are "transitional" zones where the coating composition varies continuously from inorganic to organic and vice versa. These "transitional" zones bridge inorganic and organic materials, which should result in a single layer structure with improved mechanical stability and stress relaxation relative to that of multilayer barrier structures.

Such a graded diffusion barrier coating also may be used to protect objects that are sensitive to environmental reactive species such as oxygen and water vapor. Such objects include, but are not limited to, organic light emitting diodes (OLEDs), liquid crystal devices (LCDs), photovoltaic cells, electrochromic devices, electrophoretic devices, and the like.

Figure 5:
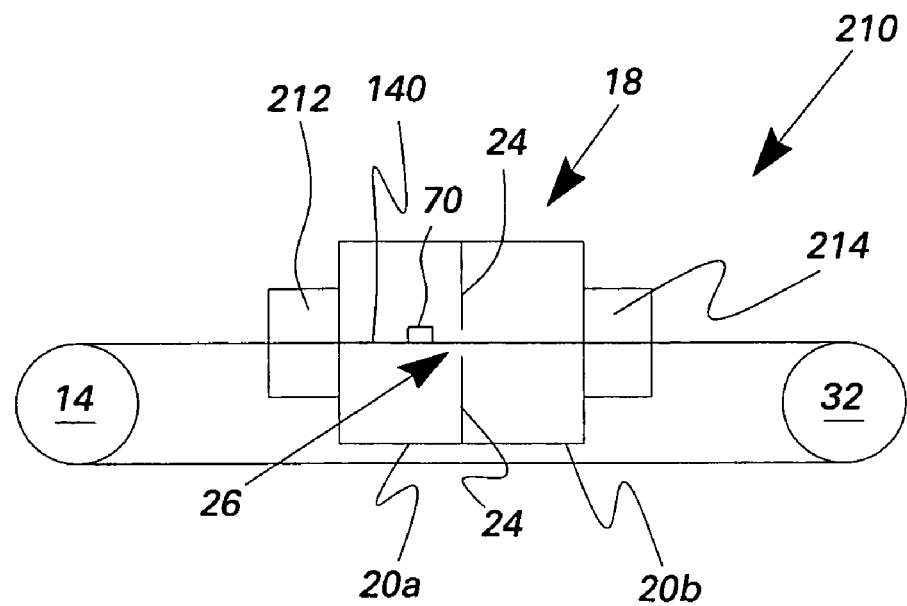
FIG. 5 is a schematic view of a selective deposition machine for use in the system of FIG. 1 and constructed in accordance with an embodiment of the invention.

Referring now to FIG. 5, the selective coating assembly 210 is shown. Fabricated electronic devices 70 may be moved from the fabrication assembly to the selective coating assembly through the use of a web or through the use of a mechanism for moving individual electronic devices 70. Examples of such a mechanism include a vacuum chuck, a claw, or adhesive tape.

The selective coating assembly 210 includes a deposition chamber 18, a first transition chamber 212, a second transition chamber 214 and a web 140. The web 140 continually loops between a first spool 14 and a second spool 32. The first transition chamber 212 provides a transition between atmospheric conditions and vacuum or inert gas conditions. The second transition chamber 214 provides a transition between vacuum or inert gas conditions of the deposition chamber 18 and atmospheric conditions. The web 140 as used in the selective coating assembly 210 of FIG. 5 differs from the web 40 as used in the substrate deposition machine 10 of FIG. 2 in that the web 140 includes open spaces 142 (FIG. 9).

Figure 6:
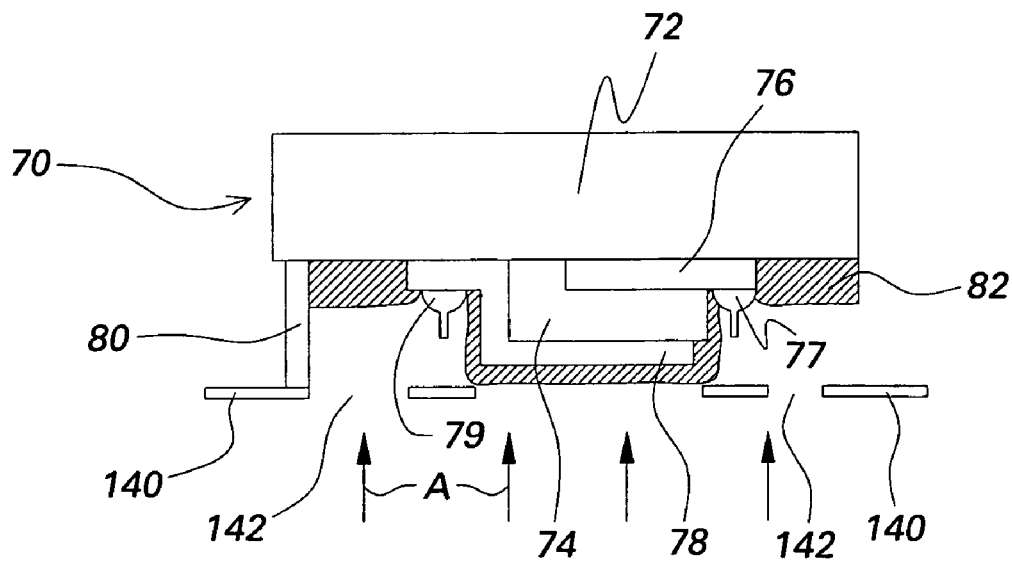
FIG. 6 is a schematic view of an object being selectively coated in the selective deposition machine of FIG. 5.

FIG. 6 illustrates an electronic device mounted on a substrate. The coating of the electronic device is a similar process to the coating of the substrate described with reference to FIG. 2. The electronic device 70 illustrated in FIG. 6 has been mounted on a substrate 72 that has been coated with a graded barrier coating in the substrate deposition machine 10. The substrate 72 may be flexible, as in a film or thin sheet of plastic or metal, or inflexible, as in a block of glass, plastic or metal. The illustrated electronic device 70, fabricated in the fabrication assembly 110, includes an OLED 74, an anode 76, and a cathode 78. A positive electric contact 77 extends from the anode 76 and a negative electric contact 79 extends from the cathode 78. It is generally desirable to coat all the portions of the electronic device 70, with the exception of the electric contacts 77, 79, to protect the electronic device 70 from reactive gaseous species such as moisture and oxygen, and/or from physical or chemical attack.

Figure 9:
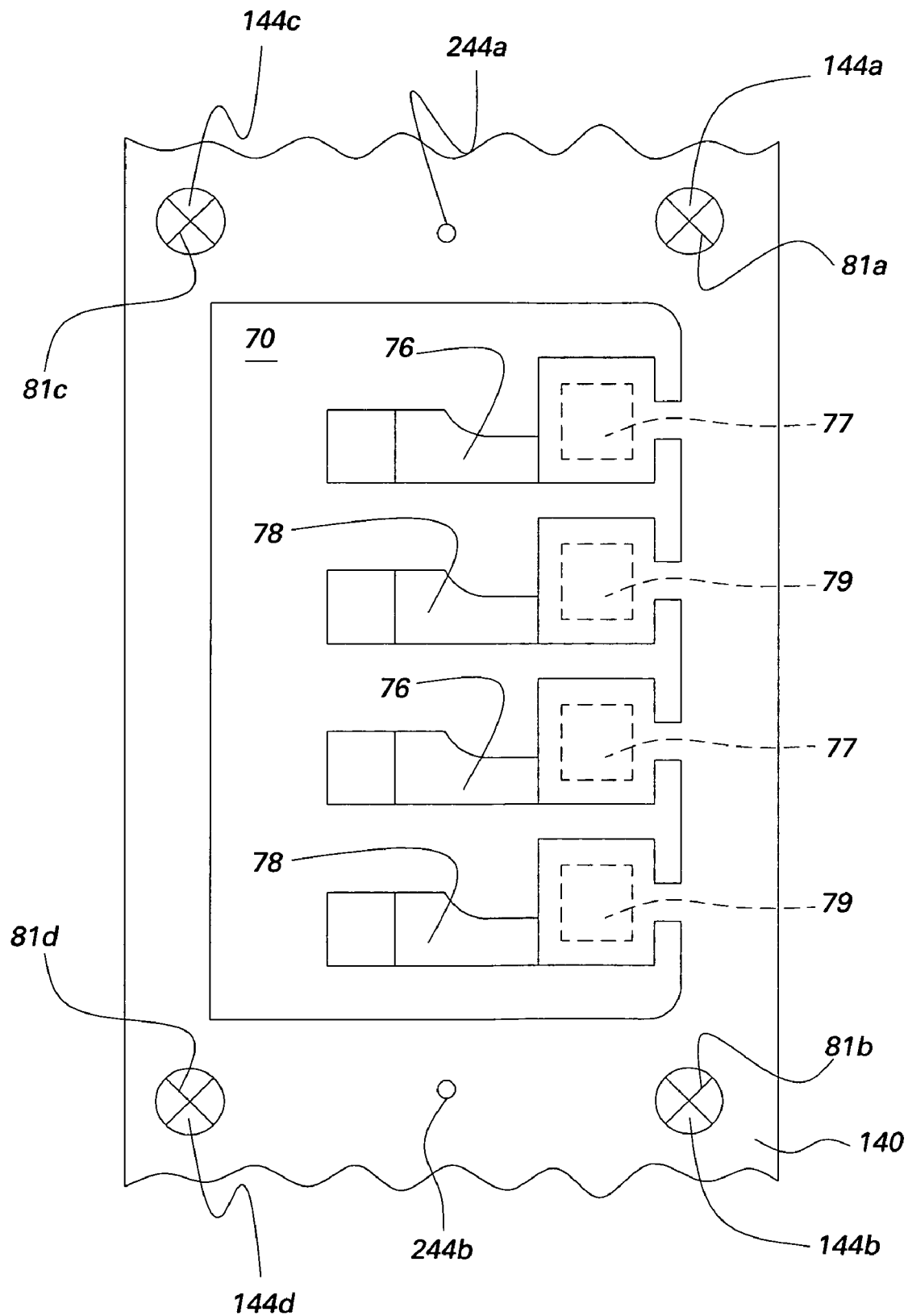
FIG. 9 is a schematic view of a shadow mask or web for use in the selective deposition machines of FIG. 5 or 7 and constructed in accordance with an embodiment of the invention.

Specifically, with reference to FIGS. 6 and 9, a coating 82 is deposited on the electronic device 70 except over the electric contacts 77, 79. The coating 82 is delivered in the direction of the arrows A. The electronic device 70 is placed on the web 140 in such a way as to allow the openings 142 to be positioned to allow coating of the portions of the electronic device 70 that are to be coated and to inhibit coating of the portions of the electronic device 70 that are not to be coated, namely the electric contacts 77, 79. The positioning of the electronic device 70 on the web 140 may be accomplished through the use of reference pins 80 on the electronic device 70 and reference markers, such as reference slots $244_a$, $244_b$, on the web 140. Only one reference pin 80 is shown in FIG. 6 for ease of illustration, although it should be appreciated that more than one reference pin 80 may be used to properly register the electronic device 70 with the web 140. Further, although the reference slots $244_a$, $244_b$ are shown generally along a midline of the web 140, it should be appreciated that the reference slots $244_a$, $244_b$ and the reference pins 80 may be located in any locations suitable for properly registering the electronic device 70 with the web 140.

Alternatively, the electronic device 70 may be registered with the web 140 through the use reference markers utilizing autocalibration techniques. For example, the web 140 may include autocalibration markers $144_{a-d}$ that are used in conjunction with complementary markers $81_{a-d}$ on the electronic device 70. The concept is to site the electronic device 70 on the web 140 so that each complementary marker 81$_{a-d}$ on the electronic device 70 is sited within a respective autocalibration marker 144$_{a-d}$ on the web 140.

Figure 7:
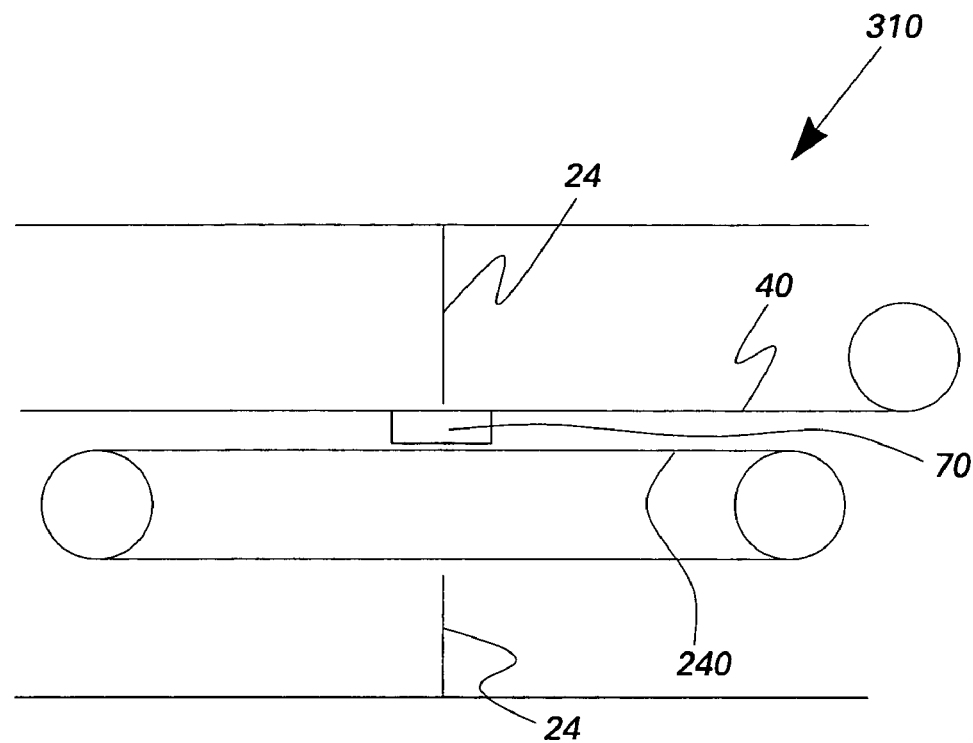
FIG. 7 is a schematic view of a selective deposition machine for use in the system of FIG. 1 and constructed in accordance with an embodiment of the invention.
Figure 8:
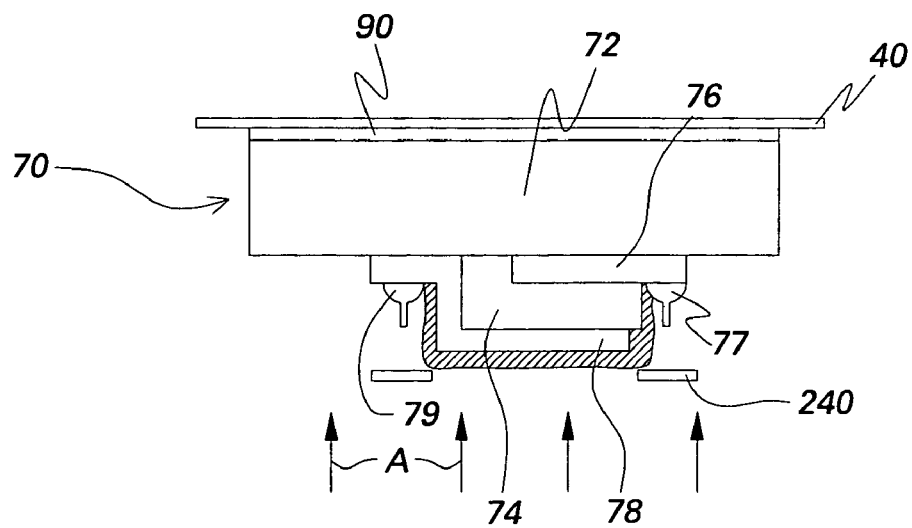
FIG. 8 is a schematic view of an object being selectively coated in the selective deposition machine of FIG. 7.

FIG. 7 illustrates an alternative selective deposition assembly 310. The selective deposition assembly 310 includes a web 40 for transporting the electronic devices 70 and web 240 that includes openings in a similar fashion as the web 140. The electronic devices 70 can be built on web 40 beforehand, such that the web 40 acts as a substrate for the electronic devices 70, or can be affixed to the web 40 with an adhesive 90. The web 240 serves as a shadow mask to inhibit coating certain portions of the electronic devices 70, namely the electric contacts 77, 79. The web 240 can be appropriately registered relative to the electronic devices 70 by altering the velocity of the web 240 relative to the velocity of the web 40.

It should be appreciated that the coating on the electronic devices 70 may be similar to the graded barrier coating used on the substrates 72 as described with reference to FIG. 2. Alternatively, the coating on the electronic devices 70 may be a hard coating designed to protect the electronic devices 70 from ultraviolet radiation or from physical or chemical attack, such as scratches and abrasion. Such suitable hard coatings may include, for example, coating compositions that include at least one resin. The resin can be an epoxy-based resin. For example, the resin can be a cycloaliphatic resin. The resin can also be an acrylic-based resin. Some epoxies may impart increased surface durability. A siloxane portion of certain diepoxies may be easily adjusted in length and branching to optimize desired properties. The hard coating composition may further include at least one flexibilizing agent, adhesive agent, surfactant or catalyst and combinations thereof. In still another aspect, the hard coating composition may be cured. The curing may be radiation curing, such as ultraviolet curing, or thermal curing and combinations thereof. Other curing mechanisms can also be employed in place of UV curing, including anhydride or amine curing. Additives can be incorporated into the leveling layer to tailor its properties. For example, a UV catalyst may be added to the layer composition. In another example, UV absorbers can be added to protect underlying UV sensitive layers. Siloxane additives can be included to make the leveling layer more scratch resistant. Antioxidant chemicals such as Irganox®, manufactured by the Geigy Chemical Corporation, hinder amine complexes and can also be added to prevent yellowing of the coating and underlying substrate. Further discussion of suitable hard coating materials, suitable coating compositions and suitable coating thickness may be found in US patent publication number US 2006/0001040.

The selectively coated electronic devices 70 may be removed from the selective coating assembly through the use of the web 40, 140 or through the use of a mechanism for moving individual electronic devices 70. Examples of such a mechanism include a vacuum chuck, a claw, or adhesive tape.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, although the electronic device 70 has been described with reference to an OLED device, it should be appreciated that any suitable electronic device may be used that requires encapsulation or coating on some but not all portions. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected by Letters Patent of the United States is:

1. A method for inhibiting coating selective portions of an object, comprising:
   providing a web upon which the object is placed, the web including a plurality of openings to allow a deposition material to coat selective portions of the object and inhibit coating of selective portions of the object;
   transporting the object through a deposition chamber comprising a first chamber area separated from a second chamber area by a baffle having an adjustable opening for controlling a migration rate of the deposition material through said opening; and
   providing the deposition material to serve as a coating.

2. The method of claim 1, comprising registering the object relative to the web to ensure the selective portions of the object remain uncoated.

3. The method of claim 2, wherein said registering comprises providing reference markers on the object and the web serving as the shadow mask.

4. The method of claim 3, wherein said providing reference markers comprises providing reference pins on the object and reference slots on the web serving as the shadow mask.

5. The method of claim 3, wherein said providing reference markers comprises providing autocalibration markers on the web serving as the shadow mask and complementary markers on the object.

6. The method of claim 1, wherein said providing a deposition material comprises producing a graded barrier coating.

7. The method of claim 1, wherein said providing a deposition material comprises producing a hard coating capable of protecting the object from at least one of ultraviolet radiation, physical damage, or chemical damage.

8. The method of claim 1, wherein said providing a deposition material comprises plasma-enhanced chemical-vapor deposition, radio-frequency plasma-enhanced chemical-vapor deposition, expanding thermal-plasma chemical-vapor deposition, sputtering including reactive sputtering, electron-cyclotron-resonance plasma-enhanced chemical-vapor deposition, inductively coupled plasma-enhanced chemical-vapor deposition, evaporation, atomic layer deposition, or combinations thereof.

* * * * *